United States Patent [19]
Passler et al.

[11] 4,063,349
[45] Dec. 20, 1977

[54] METHOD OF PROTECTING MICROPACKAGES FROM THEIR ENVIRONMENT

[75] Inventors: Herbert Edwin Passler; James David Fredenberg, both of Phoenix, Ariz.

[73] Assignee: Honeywell Information Systems Inc., Phoenix, Ariz.

[21] Appl. No.: 746,755

[22] Filed: Dec. 2, 1976

[51] Int. Cl.² .............................................. H05K 3/28
[52] U.S. Cl. ........................................ 29/627; 53/7; 53/22 R
[58] Field of Search ................. 53/7, 22 R, 22 A, 86; 29/627

[56] References Cited

U.S. PATENT DOCUMENTS

| 2,780,043 | 2/1957 | Hensgen | 53/86 |
| 3,052,012 | 9/1962 | Ravich | 53/7 X |
| 3,405,441 | 10/1968 | Asher et al. | 29/627 |

Primary Examiner—Travis S. McGehee
Attorney, Agent, or Firm—Edward W. Hughes; William W. Holloway, Jr.

[57] ABSTRACT

A method of protecting active and passive electronic components on a portion of one surface of a multilayer substrate of a micropackage from deleterious constituents of the ambient atmosphere, primarily water vapor. A segment of a thin, flexible, substantially nonpermeable and nonadhering membrane, or sheet, has its perimeter secured to the substrate by a bead of sealant adhesive. The exposed surface of the segment has applied to it a thicker coating of a substantially nonpermeable sealant adhesive material which adheres to the membrane and the bead of sealant adhesive. A small opening is formed through the coating and the segment to provide communication with the area between the surface of the substrate on which the components are mounted and the inner surface of the segment. The substrate is placed in a chamber which is substantially evacuated to remove gases trapped under the segment. The opening formed through the coating and the segment is sealed by a drop of adhesive sealant while the substrate is in the evacuated chamber.

10 Claims, 10 Drawing Figures

METHOD OF PROTECTING MICROPACKAGES FROM THEIR ENVIRONMENT

BACKGROUND OF THE INVENTION

1. Field of the Invention

This invention relates to the field of methods of protecting electronic components mounted on a substrate from the ambient atmosphere by providing them with a protective cover which envelopes the components. The perimeter of a segment of a thin flexible membrane which is made of a substantially impermeable nonadhering material is secured by a bead of sealant adhesive at the perimeter of the substrate to enclose the components to be protected. The exposed surface of the segment is coated with a layer of substantially nonpermeable material which is substantially thicker than the membrane of the segment and which does adhere to the membrane. A small opening is formed through the layer and segment. The space under the segment is substantially evacuated, and the opening formed through the layer and segment is sealed.

2. Description of the Prior Art

There is a trend in microelectronic circuit packaging technology toward the use of micropackages comprised of ceramic multilayer printed circuit wiring matrices, or substrates. Each such substrate has formed on it a number of alternate layers of conductive and insulative materials. A large number (i.e., from 50 to 100) of large scale integrated circuit semiconductor chips are mounted within the component area of one surface of a substrate. In a preferred embodiment the top surface of a substrate is substantially a square having dimensions of 80mm by 80mm. To protect the active components, such as large scale integrated circuit chips, hereinafter I.C. chips, their flexible beam leads, and discrete components, such as capacitors mounted within the component area of a substrate from damage by deleterious constituents of the ambient atmosphere, it is the practice to hermetically seal the component space of the substrate. The component space is defined as that space or volume within which both active and passive components of a given substrate are mounted. Hermetically sealing this space has been accomplished by soldering a metallic vertical wall, or riser, to the substrate around the perimeter of the component area and then soldering a metallic cover plate to the top of the riser. The component space is then substantially evacuated and sealed.

The problems encountered in using such a hermetic seal to protect large scale I.C. chips, their leads, discrete components, and the surface of the substrate within the component area from the deleterious constituents of the ambient atmosphere is that hermetic seals fail too frequently and too unpredictably to be used with commercial products such as digital computer systems. One of the reasons for these failures is the consequence of the necessity of soldering different components to a substrate at different times. As a result, it is necessary to use solders which have substantially different melting points. However, the range of temperatures is limited by the maximum temperature to which I.C. chips can be subjected without risk of damage as the maximum and the normal operating temperatures encountered in use of a substrate as the minimum. Since the top plate is soldered last, the lowest temperature solder, which is usually the weakest, is used to solder the top plate to the riser. As a result, it is difficult to consistently obtain solder joints that remain air tight, or hermetic, in use.

Still another probable cause of failures which exacerbates the first is the result of the relatively large forces applied to the top plate and the riser to which the top plate is soldered, particularly because of the large area of the top plate which approaches 56 sq. cms. Thus, any change in ambient atmospheric pressure changes the force on the top plate. Since the atmospheric pressure is constantly changing, so are the forces applied to the seal between the plate and the riser which accelerates failures.

Another problem with hermetically sealed micropackages occurs when any of the active or passive components mounted on the component surface of such a substrate have to be repaired or replaced. To remove the top plate it is necessary to subject a substrate to the amount of heat necessary to unsolder the top plate. Such heat can damage or shorten the useful lives of the remaining components and if not carefully controlled, can result in unsoldering other soldered parts of the micropackage.

A most deleterious component of the ambient atmosphere is water vapor. The reason water vapor is harmful is because it reacts to form acids with chlorides in the residue of the flux used in soldering chips and their leads to the substrate. The resulting acids chemically attack the leads and the I.C. chips which ultimately causes electrical failures primarily where the leads are soldered or bonded either to an I.C. chip or to the substrate.

As a result of this invention, it has been found that it is not necessary to protect active and passive components of a micropackage from changes in ambient atmospheric pressure to adequately protect the chips, their leads and other components mounted in the component area of a substrate from being damaged by constituents in the ambient atmosphere. It has also been found that such components can be adequately protected from the deleterious constituents in their ambient atmosphere by a process which provides a relatively flexible impermeable protective cover for such components which process does not require the micropackage to be subjected to temperatures other than ambient.

BRIEF SUMMARY OF THE INVENTION

The present invention provides a method of protecting active and passive electronic components mounted on the surface of a multilayer substrate from their environment, more particularly, from the ambient atmosphere. This is accomplished by a segment of a thin membrane that fits over, or covers, the component area of the substrate on which such components are mounted. The membrane is chosen from one that is substantially nonadhering and impermeable to the gases found in the ambient atmosphere of electronic systems, particularly to moisture vapor, such as a thin, 0.001 to 0.005 inches thick, sheet of latex rubber, Mylar, Tedlar, Saran, cellophane, or the like. The perimeter of the segment is then secured to the substrate by a bead of a suitable sealant adhesive such as a room temperature vulcanizing silicone. After the segment is suitably sealed at and secured by its perimeter to the substrate, the segment is provided with a substantially thicker layer of a room temperature vulcanizing silicone which may be applied by brush or spray with the silicone thinned appropriately for the manner of application. After the silicone liquid coating has substantially completely vulcanized, normally after a period of 24 hours has elapsed, a small opening is formed through the silicone layer and the segment which together form a protective cover to provide communication with the component space defined by the inner surface of the segment and the surface of the substrate on which the electronic components to be protected are mounted. The substrate is then put into a chamber which is evacuated to a pressure substantially in the range of 1 inch, (2.5 centimeters) of mercury. The opening in the protective cover is then sealed. The preferred manner of sealing the opening through the protective cover is to put a drop of liquid room temperature vulcanizing silicone rubber over the opening just before the substrate is subjected to the reduced pressure. The substrate is maintained at the reduced pressure until the drop of slicone rubber vulcanizes sufficiently to seal the opening; normally a period of around ten minutes. Thereafter, the component space between the inner surface of the segment and the surface of the substrate on which the components are mounted is protected from moisture found in the ambient atmosphere and from other possible deleterious constituents of the atmosphere, such as organic or inorganic acids and bases that could potentially damage the I.C. chips, their leads, and any other components that may be mounted on a substrate within the protected component space.

The problems of the prior art are solved by the present invention by forming a protective cover for such components using a segment or portion of very thin flexible membrane that is secured to the substrate at the perimeter of the component area by a bead of room temperature vulcanizing adhesive sealant. A big advantage of forming a flexible protective cover is that such a cover distributes the force due to ambient atmospheric pressure substantially uniformly across the whole component area rather than concentrating it, at its perimeter, for example, or at a few points. The concentration of such a large force at a few small areas, particularly if such areas are located where leads are secured to I.C. chips, could overstress the leads and their bonds to the components and to the substrate sufficient to cause a failure. Also, because of the nature of the silicone sealant and the membrane from which the segment is made, the protective cover can be readily removed by passing a sharp knife edge around the perimeter of the protective cover since the segment does not adhere to the components, to provide easy access to the I.C. chips, their leads and other components mounted on the substrate if repairs or changes to the micropackage are necessary.

It is therefore an object of this invention to provide a process for environmentally sealing components mounted on a substrate.

It is a further object of this invention to provide a method for producing a protective cover for the active and passive electronic components of a multilayer substrate that is flexible, impermeable to moisture and which does not adhere to the components to be protected.

It is still another object of this invention to provide a process for producing a protective cover for the active and passive components and the surface of a substrate on which these components are mounted which protects such components and surface from the ambient atmosphere and which cover is readily removable from the substrate and from the components.

It is a still further object of this invention to provide a method of protecting the active and passive electronic components mounted on a surface or substrate including their leads, and that portion of the surface of the substrate on which they are mounted from damaging stresses due to changes in atmospheric pressure from deleterious components of the ambient atmosphere, which is relatively economical to use and which facilitates repair of such components and substrates with a minimum of equipment required.

BRIEF DESCRIPTION OF THE DRAWINGS

Other objects, features and advantages of the invention will be readily apparent from the following description of the preferred process taken in conjunction with the accompanying drawings. Although variations and modifications may be affected without departing from the spirit and scope of the novel concepts of the disclosure and in which.

DESCRIPTION OF THE PREFERRED EMBODIMENT

Figure 1:
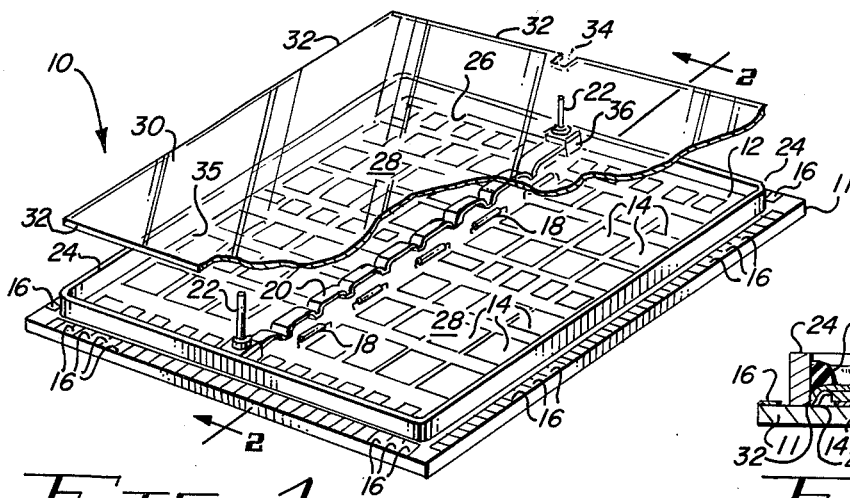
FIG. 1 is a perspective view of an initial step of the process of protecting the components mounted on a multilayer substrate from the ambient atmosphere.

In FIG. 1, micropackage 10 includes a multilayer substrate 11. The top surface 12 of substrate 11 is, in a preferred embodiment, substantially a square with dimensions 80mm by 80mm and has a thickness of from 1 to 2mm. Substrate 11 is preferably made of an electrically non-conductive ceramic material such as aluminum oxide. On top surface 12 of the multilayer substrate 11, there is normally built up or formed a plurality of alternate layers, up to 8 in some examples, of an electrically conductive material and of an electrically insulating material. A relatively large number, 50 to 100, of large scale I.C. chips 14 can be mounted on top surface 12. Details of multilayer substrate 11 and of I.C. chips 14 are not illustrated since they form no part of this invention and are well known in the art. Formed along the edges of substrate 11 are a plurality of electrical contacts 16 which are adapted to engage electrical contacts of a conventional connector which connector is mounted on a panel. Such panels can be a multilayer circuit board and are used to interconnect and to energize a plurality of micropackages 10 to form an operational electronic system such as a digital computer system. Details of such connectors, panels and computer systems are not illustrated since they are well known. In addition to the large scale I.C. chips 14, discrete passive components such as capacitors 18 can also be mounted on the surface 12. A power distribution, bus 20 is provided to supply dc voltage through conductive runs formed on substrate 11 to the I.C. chips 14. A conventional power supply, which is not illustrated, is connected to bus 20 through pins 22. A metal riser, 24, is soldered around the outer edges or perimeter 26 of the component area 28 of upper surface 12 of substrate 11 on which components such as I.C. chips 14, capacitors 18 and bus 20 are mounted. Riser 24 is spaced inwardly slightly from the outer edge of substrate 11 so that electrical contacts 16 can engage corresponding conductive elements of a suitable connector to make interconnections between one micropackage 10 and another, for example.

Figure 6:
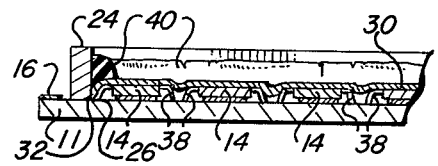
FIG. 6 is an enlarged fragmented section taken along line 6—6 of FIG. 5.
Figure 2:
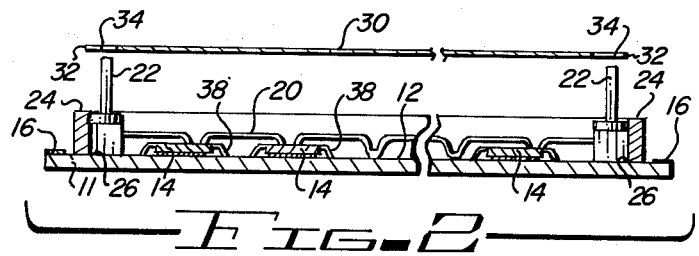
FIG. 2 is an enlarged fragmentary section taken along line 2—2 of FIG. 1.
Figure 3:
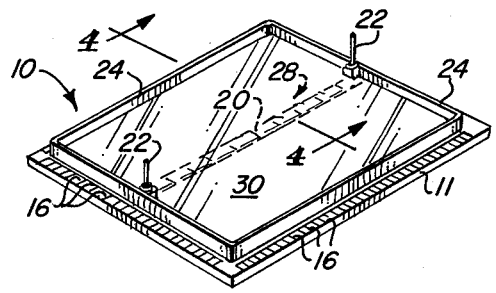
FIG. 3 is a perspective illustrating the position of a segment of a protective membrane on the substrate prior to the membrane being secured to the substrate.
Figure 8:
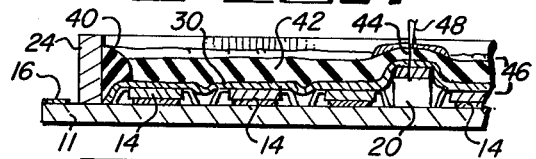
FIG. 8 is an enlarged fragmented section taken on line 8—8.
Figure 4:
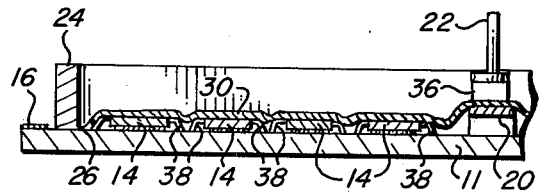
FIG. 4 is an enlarged fragmentary section taken on line 4—4 of FIG. 3.
Figure 9:
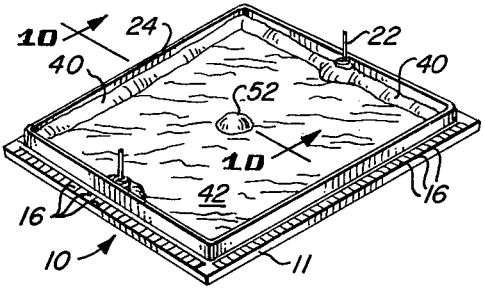
FIG. 9 illustrates the results of the completed process.
Figure 5:
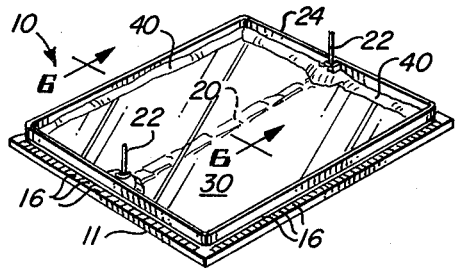
FIG. 5 illustrates another step in the process.
Figure 10:
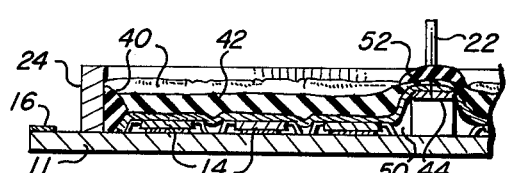
FIG. 10 is an enlarged fragmented section taken on line 10—10 of FIG. 9.

A substantially square segment or portion 30 of a membrane is cut, or formed, to fit within the perimeter 26 of component area 28 defined by the intersection of the interior walls of vertical riser 24 and substrate 11. Segment 30 also has notches 34 cut into it to fit around insulators 36 that electrically insulate pins 22 from riser 24 since riser 24 is normally grounded. The material from which segment 30 is made is preferably a membrane, or sheet, having a thickness of from 0.001 to 0.005 inches. The material is chosen from those which are substantially impermeable to water vapor and which, because of the thinness of the segment, are relatively flexible so that even though the inner surface of segment 30 does contact the very thin flexible leads 38 which connect an integrated circuit chip 14 to substrate 11, the pressures applied will be substantially uniformly distributed so as to be low enough not to damage either a chip or its leads. Suitable materials from which segment 30 can be formed are polyesters such as Mylar, polyvinyl fluorides such as Tedlar, polyvinylidene chlorides such as Saran, cellulose such as cellophane, or latex rubbers. Referring to FIG. 2 it can be seen that the perimeter 32 of segment 30 is substantially congruent with the perimeter 26 of component area 28. Segment 30 is then placed so as to cover component area 28 as can be seen in FIGS. 3 and 4. The materials from which segment 30 is made do not adhere to chips 14, their leads 38 or any other object positioned on surface 12 of substrate 11 within component area 28 which it normally comes in contact with. After segment 30 has been put in place as seen in FIGS. 3 and 4, a bead 40 of a suitable adhesive sealant is placed around the perimeter 32 of segment 30 in contact with segment 30, the inner surface of the riser 24 as can be seen in FIGS. 5 and 6, and the surface of substrate 11 in the vicinity of perimeter 26 of component area 28. A room temperature vulcanizing thixotropic silicone rubber such as Dow-Corning 3140 RTV makes an excellent adhesive sealant to obtain a substantially impermeable seal between the perimeter 32 of the segment 30 and the perimeter 26 of component area 28, as can be seen in FIGS. 5 and 6.

After bead 40 has substantially vulcanized or set, which normally requires a period of 24 hours but which period of time is not critical, a layer 42 of an adhesive sealant such as silicone diluted by suitable silicone solvent is brushed or sprayed on the exposed or outer surface of segment 30. Examples of a suitable adhesive sealant and solvent are Dow-Corning 3140 RTV and Dow-Corning No. 200 fluid respectively. A preferred thickness for layer 42 is within the range of from 0.010 to 0.012 inches. Layer 42 is substantially impermeable to moisture and adheres to the outer surface of segment 30 and to the bead 40 of sealant adherent. After layer 42 has vulcanized, normally after a period of from 12 to 24 hours has elapsed, again the time is not critical, a small opening 44 is formed through layer 42 and segment 30.

Figure 7:
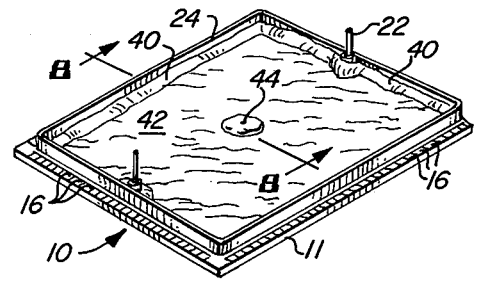
FIG. 7 illustrates still another step in the process.

Layer 42 and segment 30 together form protective cover 46 as seen in FIG. 7. A sharply pointed object 48, such as a reasonably large needle or the point of a stylus, for example, can be used to form opening 44.

In the preferred embodiment object 48 is inserted through the protective cover 46 in the vicinity of bus 20 so as not to strike a chip 14. After hole, or opening 44, has been formed, the component space or volume 50, the boundaries of which are the surface 12 of substrate 11 and the inner surface of segment 30, is ready to be evacuated. This is accomplished by placing micropackage 10 in a conventional vacuum chamber which is not illustrated. Preferably just before the micropackage 10 is placed in such a vacuum chamber, a drop 52 of a liquid adhesive sealant such as silicone is placed on top of opening 44. During the process of reducing the pressure in the vacuum chamber, gases in component space 50 will escape through opening 44 and bubble through the drop 52 of a thixotropic silicone. A suitable adhesive sealant for drop 52 is Dow-Corning's 3140 silicone sealant. Subjecting a micropackage 10 to a vacuum, or reduced pressure, for a period of 10 minutes at 1 inch of mercury is adequate to remove a significant percentage of the gases trapped in the component space 50 before drop 52 vulcanizes. The exact minimum pressure again is not critical. After opening 44 is properly sealed the process of providing a protective cover for the components of micropackage 10 is complete.

One benefit derived from using riser 24 is that riser 24 makes it easier to remove the protective cover 46 including bead 40 whenever it is desirable to gain access to the component space 50 of substrate 11 to replace a non-functioning I.C. chip or to repair connection between a chip and the substrate that failed, for example. Obviously, after protective cover 46 has been removed to make repairs, for example, the process by which the component space 50 of a micropackage 10 was previously sealed and protected from the ambient atmosphere, can be readily repeated without the necessity of elaborate graduated heating equipment. As a result, it is possible for service personnel to practice this method of protecting micropackages from their environment in a service as well as in a manufacturing environment.

Because of the flexibility of the material from which segment 30 is made as well as the flexibility of silicone layer 42, no damaging stresses are applied to chips 14, discrete components 18 and their electrical leads that connect them to substrate 11.

Although the invention has been described and defined with reference to a preferred embodiment, it will be obvious to those skilled in the art to which the invention pertains that many modifications of the invention may be made by those skilled in such art without departing from the scope of the invention as disclosed and claimed.

What is claimed is:

1. A process for protecting from the ambient environment components mounted on a component area of a surface of a substrate, said component area having a perimeter; said process comprising the steps of:
   a. cutting a segment of a substantially nonpermeable flexible membrane to a shape that is substantially congruent with the perimeter of the component area of the substrate, said segment having an inner and outer surface,
   b. attaching the segment to the perimeter of the component area with a sealant adhesive, c. coating the outer surface of the segment with a layer of substantially impermeable material that adheres to the membrane and to the sealant adhesive, d. forming a small opening through the layer and the segment, e. subjecting the substrate to substantially reduced pressure, and f. sealing the opening formed through the layer and the segment with an adhesive sealant while the substrate is subjected to such a reduced pressure.

2. The method of claim 1 in which the membrane from which the segment is cut is made of a material selected from the group consisting of polyesters, polyvinyl fluorides, polyvinylidene chlorides, latex rubbers, and cellulose.

3. The method of claim 2 in which the thickness of the segment is in the range of from 0.001 to 0.005 inches.

4. A method for protecting active and passive electronic components mounted within a given component area of one substantially planar surface of a multilayer substrate from the ambient environment, said component area having a perimeter, said method comprising the steps of:

a. cutting a segment of a thin membrane made of a material substantially nonpermeable to water vapor to a size that substantially covers the area of the substrate on which the components are mounted, said segment having a perimeter that substantially coincides with the perimeter of the component area of the substrate and having an inner and an outer surface;

b. attaching the perimeter of the segment to the substrate substantially at the perimeter of the component area with a sealant adhesive;

c. coating the outer surface of the membrane with a layer of a sealant adhesive having a thickness substantially greater than the thickness of the membrane, said layer of sealant adhesive adhering to the outer surface of the membrane and to the sealant adhesive;

d. forming a small opening through the layer and the segment;

e. subjecting the substrate to substantially reduced atmospheric pressure substantially in the range of one inch of mercury; and, f. sealing the opening formed through the layer and the segment with a sealant adhesive while the substrate is subjected to such substantially reduced atmosphere.

5. The method of claim 4 in which the membrane from which the segment is cut is made of a material selected from the group consisting of polyesters, polyvinyl fluorides, polyvinylidene chlorides, latex rubbers, and celluloses.

6. The method of claim 5 in which the thickness of the membrane is in the range of from 0.001 to 0.005 inches.

7. A method for protecting a plurality of large scale integrated circuit chips and passive electronic components mounted within a component area on a substantially planar surface of a multilayer substrate from the ambient environment, said component area having a perimeter, said method comprising the steps of:

a. securing a vertical riser to the perimeter, said riser having an inner wall;

b. forming a segment of a thin nonpermeable nonadherable membrane to a shape that substantially covers the component area of the substrate and the components mounted on the substrate in the component area, said membrane having a perimeter that substantially contacts the inner wall of the riser, said segment having an inner and outer surface;

c. attaching the perimeter of the segment to the inner wall of the riser with a bead of room temperature vulcanizing silicone adhesive sealant;

d. coating the outer surface of the segment with a substantial layer of substantially impermeable silicone adhesive sealant which is substantially thicker than the membrane of said segment and which adheres to the outer surface of the segment and to the bead of sealant adhesive;

e. forming an opening through the coating and the segment;

f. placing the substrate in a chamber and substantially reducing the atmospheric pressure in the chamber; and g. sealing the opening formed through outer layer and the segment with a room temperature vulcanizing silicone adhesive sealant while the substrate remains in the chamber at such a reduced atmospheric pressure.

8. The method of claim 7 in which the membrane of the segment is made of a material selected from the group consisting of polyesters, polyvinyl fluorides, polyvinylidene chlorides, latex rubbers, and cellulose.

9. The method of claim 8 in which the thickness of the segment is in the range of from 0.001 to 0.005 inches.

10. The method of claim 9 in which the thickness of the layer is in the range of from 0.010 to 0.015 inches.

* * * * *